United States Patent [19]

Anger et al.

[11] 4,393,308

[45] Jul. 12, 1983

[54] HIGH CURRENT ELECTRON SOURCE

[75] Inventors: Klaus Anger, Munich; Juergen Frosien, Berlin; Burkhard Lischke; Erich Plies, both of Munich; Klaus Tonar, Berlin, all of Fed. Rep. of Germany

[73] Assignee: Siemens Aktiengesellschaft, Berlin & Munich, Fed. Rep. of Germany

[21] Appl. No.: 240,881

[22] Filed: Mar. 5, 1981

[30] Foreign Application Priority Data

Mar. 20, 1980 [DE] Fed. Rep. of Germany ....... 3010815

[51] Int. Cl.$^3$ ............................................. H01J 37/00
[52] U.S. Cl. ........................ 250/396 R; 250/396 ML; 313/361.1
[58] Field of Search ......... 250/492.2, 396 ML, 396 R; 313/361.1, 363.1; 328/229, 230, 228

[56] References Cited

U.S. PATENT DOCUMENTS 3,209,147  9/1965  Dupouy et al. ............. 250/396 ML
3,736,423  5/1973  Katagiri et al. ............. 250/396 ML
4,063,098 12/1977  Enge ............................... 250/396 R Primary Examiner—Bruce C. Anderson Attorney, Agent, or Firm—Hill, Van Santen, Steadman, Chiara & Simpson

[57] ABSTRACT

A high current electron source with a narrow energy band of the type employed in an electron beam printer has a beam generating system consisting of a cathode and focusing electrodes and an anode with at least one electrode functioning to astigmatically focus at least one electron crossover in the low velocity range. For varying the position and shape of the crossover in a simple manner for adaptation to particular use conditions of the high current electron source, the Wehnelt electrode of the electron source consists of one or more cylinder lenses or of an electrostatic multipole element, or an electromagnetic multipole element is disposed in the plane of a conventional non-ferromagnetic Wehnelt electrode with a circular aperture for the electron beam. By pole reversal of the Wehnelt voltage or of the coil current and by changing the size of the current, the shape and azimuth position of the first crossover in the cathode space can be varied to any configuration. By so doing, an energy spread of the electrons is prevented and an optimum illumination of surfaces to be imaged is achieved.

6 Claims, 22 Drawing Figures

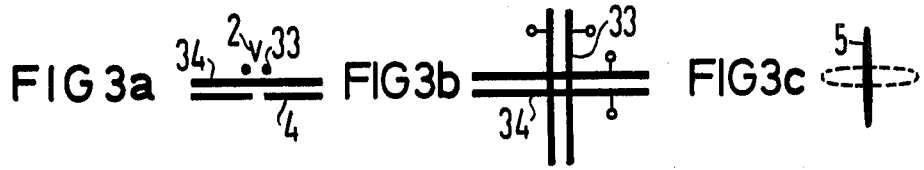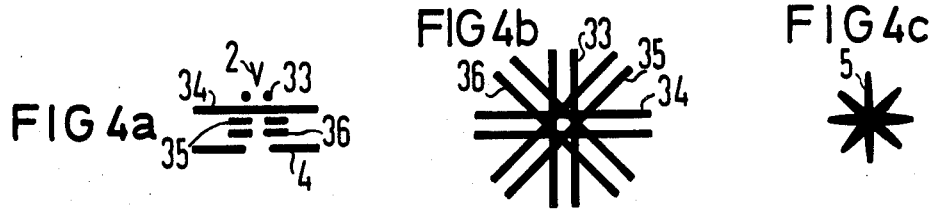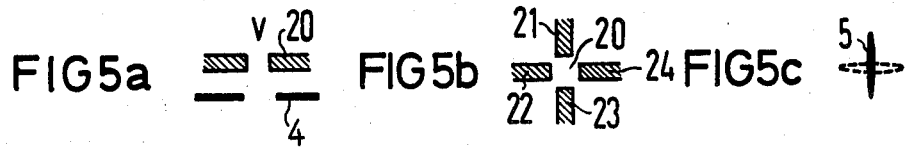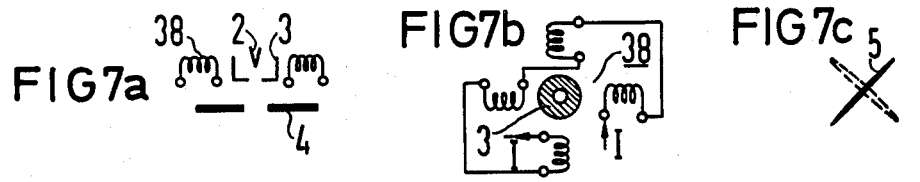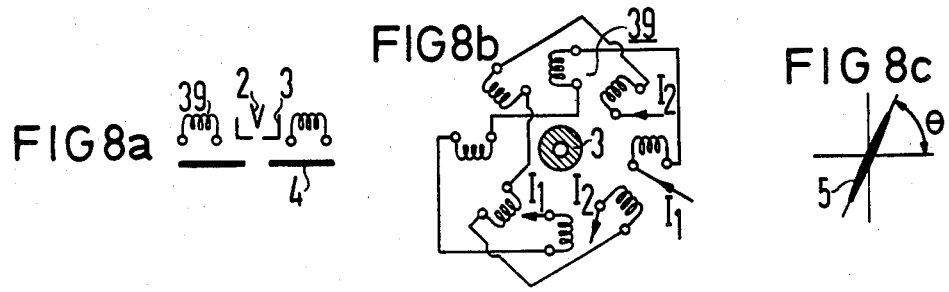

HIGH CURRENT ELECTRON SOURCE

BACKGROUND OF THE INVENTION

1. Field of the Invention

The present invention relates to high current electron sources having a narrow energy band such as are employed in electron beam printing devices, and particularly to such an electron source having a beam generating system consisting of a cathode and focusing electrodes and an anode wherein at least one electrode astigmatically focuses the electrons in the range of lower velocities in at least one crossover.

2. Description of the Prior Art

It has been experimentally shown that a narrow energy window or band of electrons generated by various emission processes such as, for example, thermal emission, Schottky emission or field emission, can only be achieved by the use of a very weak beam current. With increasing beam current, a spread of the energy distribution of the emitted electrons occurs which is a result of the Coulombian interaction of the electrons in the real crossover of the beam generating system and/or in the crossing areas occurring after the anode in the direction of electron beam flow. The sensitivity of the electrons to such Coulombian interactions is particularaly great in the cathode space where the velocity of the emitted electrons is still very small.

According to the calculations of H. Rose reported at the 19th Session of the Deutschen Gesellschaft fur Electronenmikroskopie of Sept. 9 through 14, 1979 in Tuebingen, the energy spread of a mono-energetic electron beam, that is, of an electron beam after the anode, is signficantly higher after traversing a stigmatic crossing point than after traversing an astigmatic crossover.

Moreover, it is also known to employ a grid electrode with a slot in the beam generating system in television tubes to reduce the energy spread in the real crossover of the beam, whereby the single crossing point which is present in the absence of the grid is replaced by two crossovers of low electron density. The positions and the dimensions of the crossovers are fixed by the size and the position of the slot in the grid. Such a technique is described in VDI Nachrichten No. 5, Feb. 2, 1979, page 8.

SUMMARY OF THE INVENTION

It is an object of the present invention to provide a high current electron source of the type described in the first paragraph of the specification having a beam generating system which permits the positions and shapes of the beam crossover to be varied in a simple manner and thus to be matched to particular use conditions of the electron source.

The above object is inventively achieved by the use of cylinder lenses as one of the focusing electrodes. By the use of a simple double cylinder lens the line-shaped crossover can be rotated by 90° whereby the individual cylinder lenses are perpendicularly disposed with respect to each other and switching is undertaken from one cylinder lens to the other. The number of possible azimuth positions of the line-shaped crossover is equal to the number of cylinder lenses employed. A conventional grate electrode can be replaced by a single cylinder lens.

The above object is also achieved in the present invention by the use of an electrostatic multipole element in place of one of the focusing electrodes. A simple quadrupole element corresponds approximately to the above-described double cylinder lens arrangement. A further embodiment of the invention employs an octupole element which consists of two quadrupole elements rotated by 45° with respect to each other, each quadrupole element having a separately variable potential connected thereto. By the use of such an octupole element, the line-shaped crossover may be rotated to any desired direction by appropriate selection of the ratio of the two potentials. The length and width of the crossover can also be varied within certain limits by appropriate selection of the potentials.

In another embodiment of the invention the above object is achieved wherein one of the focusing electrodes consisting of non-ferromagnetic material and has an aperture for the electron beam and an electromagnetic multipole element is disposed approximately in the plane of the electrode perpendicular to the direction of the electron beam. The position and the shape of the crossover can similarly be varied by the use of this arrangement.

In this embodiment an octupole element may also be utilized as the multipole element, wherein said octupole element is constructed as described above of two quadrupole elements rotated by 45° with respect to one another. The quadrupole elements in this embodiment are each supplied with separately variable currents so that the angular position of the crossover can be rotated as desired by appropriate selection of the ratio of the currents of the octupole element. It will also be understood that a randomly rotatable quadrupole field can be generated both with electrostatic as well as with electromagnetic hexapole elements and thus, the desired rotation of the crossover can be achieved.

The inventive concept disclosed herein embodied in high current electron sources can be employed with particular advantage in electron beam printers having variably shaped probe cross-sections as well as in such printers having probe cross-sections shaped according to characteristic patterns. Such printing devices are described, for example, in "Proceedings of the Symposium on Electron and Ion Beam Science and Technology, 8th International Conference," Vol. 78-5, at pages 149 through 159.

In such known electron beam printers, the processing time for the exposure of an entire semiconductor disc with a prescribed patters has already been greatly reduced by means of the particular shape of the electron beam probe. A further reduction of the work time for economical generation of a multitude of integrated semiconductor discs can, assuming the same electron resist sensitivity, be achieved by increasing the electron beam current density, that is, by employing a high current electron source. In order to avoid the unwanted influence on the resolution of the system, and thus, the edge sharpness of the imaged structures, the generated electrons must be as mono-energetic as possible. The inventive high current electron source with a low energy band is well-suited for this purpose. As a result of the ability to simply change the position of the crossover area as well as the shape of the crossover, the masks employed in the beam path for generating the shaped electron probe are essentially illuminated only in the areas corresponding to the required pattern. In conventional electron sources, unexploited areas of the masks were also illuminated so that the overall electron density was reduced in the probe area which was finally imaged.

DESCRIPTION OF THE DRAWINGS

FIGS. 2a and 2b respectively show schematic and elevational views of a conventional beam generating system for an electron beam printer and FIG. 2c shows the crossover generated thereby.

FIGS. 3a and 3b respectively show side and elevational views of a first embodiment of a beam generating system constructed in accordance with the principles of the present invention and FIG. 3c shows the crossover generated thereby.

FIGS. 4a and 4b respectively show side and elevational views of a second embodiment of a beam generating system constructed in accordance with the principles of the present invention and FIG. 4c shows the crossover generated thereby.

FIGS. 5a and 5b respectively show side and elevational views of a third embodiment of a beam generating system constructed in accordance with the principles of the present invention and FIG. 5c shows the crossover generated thereby.

FIGS. 6a and 6b respectively show side and elevational views of a fourth embodiment of a beam generating system constructed in accordance with the principles of the present invention and FIG. 6c shows the crossover generated thereby.

FIGS. 7a and 7b respectively show side and elevational views of a fifth embodiment of a beam generating system constructed in accordance with the principles of the present invention and FIG. 7c shows the crossover generated thereby.

FIGS. 8a and 8b respectively show side and elevational views of a sixth embodiment of a beam generating system constructed in accordance with the principles of the present invention and FIG. 8c shows the crossover generated thereby.

DESCRIPTION OF THE PREFERRED EMBODIMENTS

Figure 1:
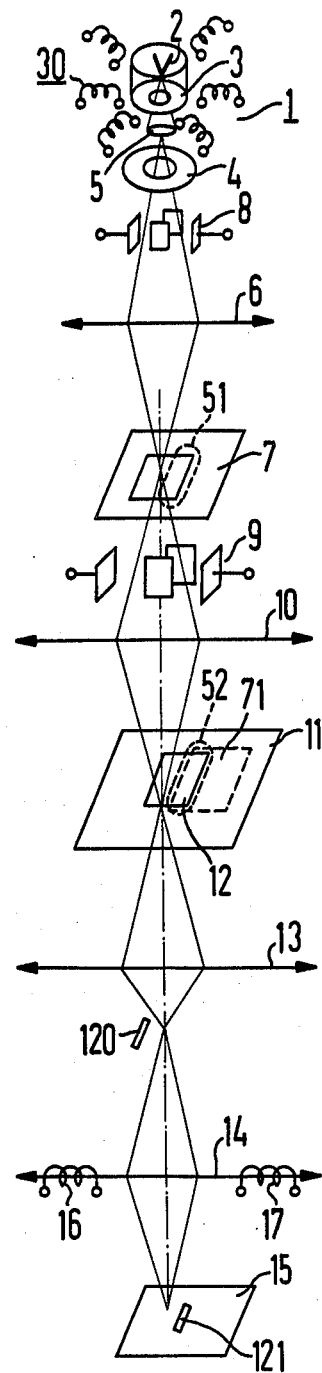
FIG. 1 is a schematic diagram of an electron beam printer with a high current electron source constructed in accordance with the principles of the present invention.

An electron beam printer is schematically shown in FIG. 1 having a beam generating system 1 consisting of a cathode 2, a Wehnelt electrode 3, and an anode 4. An electromagnetic hexapole element 30 having six coils is disposed around the non-ferromagnetic Wehnelt electrode 3. By the use of the hexipole element 30, a line-shaped crossover 5 of any desired azimuth position can be generated in the cathode space.

The crossover 5 is imaged on a first diaphragm 7 with a first illumination lens 6 which is schematically shown by an arrow. By means of a conventional electrostatic deflection system 8 disposed approximately in the front focal plane of the illumination lens 6, an image 51 of the crossover, indicated with dashed lines, can be displaced on the diaphragm 7.

By means of a further deflection system 9 and a second illumination lens 10, the diaphragm 7 is imaged on a second diaphragm 11 in such a manner that the diaphragm 11 and the image 71 of the diaphragm 7 partially overlap. The overlap area 12 is adjustable by the deflection system 9. The image 52 of the crossover image 51 is indicated in the plane of the diaphragm 11 with dashed lines. As can be seen from FIG. 1, the overlap area 12 is optimally illuminated by means of the line-shaped crossover and is imaged on a wafer plane 15 through a reduction lens 13 and an imaging lens 14. The images of the area 12 are schematically shown referenced at 120 and 121. An additional deflection system comprised of coils 16 and 17 permits the generated images to be displaced on the wafer plate 15.

As will be understood by those skilled in the art, any individual lens shown in FIG. 1 may be replaced by a lens system, and the deflection systems shown in FIG. 1 may be electrostatic or magnetic.

In an attempt to avoid an undesired energy spread of the electron beam, the crossover 5 has been distorted into a line by the beam generating system 1. If necessary, this distortion may be reversed by the employment of a cylinder lens for one of the subsequent illuminating lenses.

A section of a beam generating system as has been used in the past in systems of the type shown in FIG. 1 is shown in FIG. 2a taken along the xz plane of FIG. 1 where the electron beam is situated along the z axis. FIG. 2a shows the conventional beam generating system having a point electrode 2, a Wehnelt electrode 31 with a slot shaped aperture 32 for the electron beam and an anode 4.

The Wehnelt electrode 31 is shown in the xy plane in FIG. 2b. The slot-shaped aperture 32 has an elongated rectangular shape. The first crossover 5 generated by the Wehnelt electrode 31 by means of astigmatic focusing is shown in FIG. 2c whereby the Coulombian interaction between the electrons, which are still moving at a relatively slow velocity, is reduced.

In the conventional system shown in FIGS. 2a, 2b and 2c the entire beam generating system, or at least the Wehnelt electrode 31, would have to be rotated if it was desired to rotate the crossover in the xy plane. In any event, conventional beam generating systems require that some mechanical operation be undertaken in order to rotate the crossover.

In order to eliminate the need for such mechanical changes, a first embodiment of the inventive concept disclosed herein is shown respectively in side and plan view in FIGS. 3a and 3b wherein the Wehnelt electrode consists of two crossed cylinder lenses 33 and 34 which may consist of two pairs of wires at Wehnelt potential. By changing from one cylinder lens 33 to the other cylinder lens 34, the line shaped crossover 5 can be rotated by 90°, as is illustrated in FIG. 3c in dashed lines. In all of the figures which follow, those labelled with c represent the xy plane.

A second embodiment is shown in FIGS. 4a and 4b wherein the Wehnelt electrode consists of four cylinder lenses 33, 34, 35 and 36 which are disposed with respect to each other by 45° and generate a line-shaped crossover in any one of the selected azimuth positions of 0°, 45°, 90° or 135 ° as shown in FIG. 4c.

A third embodiment of the invention is shown in FIGS. 5a and 5b wherein the beam generating system utilizes a quadrupole element 20 as the Wehnelt electrode. The effect of the structure shown in FIGS. 5a and 5b corresponds to that achieved with the two cylinder lenses shown in FIGS. 3a and 3b. As shown in FIG. 5c, the crossover 5 can be rotated by switching the potential from one pair of quadrupole elements, such as 21 and 23, to the other pair of quadrupole elements such as elements 22 and 24.

A fourth embodiment of the invention is shown in FIGS. 6a and 6b employing an octupole element 25 which permits rotation of the crossover 5 to any desired angle $\theta$ as shown in FIG. 6c. The octupole element 25 essentially consists of two quadrupole elements offset by 45° each of which are supplied with a separately variable voltage such as $U_1$ and $U_2$ (not shown). The angle $\theta$ is selected by appropriate selection of the voltage ratio $U_2/U_1$.

A fifth embodiment of the invention is shown in FIGS. 7a and 7b employing a Wehnelt electrode 3 as shown in FIG. 1 having a circular aperture for the electron beam in combination with an electromagnetic quadrupole element 38 consisting of four coils connected in series and disposed in a plane symmetrically around the Wehnelt electrode 3. The coils in the quadrupole element 38 are supplied with a current I and by reversing the direction of the current I the crossover 5 can be rotated by 90° as shown in FIG. 7c. The shape of the crossover 5 can be varied by varying the magnitude of the current I.

A sixth embodiment of the invention is shown in FIGS. 8a and 8b employing an electromagnetic octupole element 39 in combination with a circular aperture Wehnelt electrode 3. The octupole element 39 essentially consists of two quadrupole elements of the type shown in FIG. 7b which are offset with respect to each other by 45° and are supplied with respective separately variable currents $I_1$ and $I_2$. In a manner analogous to the variations possible in the embodiments shown in FIGS. 6a and 6b, the angle $\theta$ of the crossover 5 can be varied by appropriate selection of the current ratio $I_2/I_1$, as shown in FIG. 8c.

As discussed in connection with FIG. 1, it is generally preferable to retain the line-shape of the crossover 5 and the various embodiments of the invention disclosed herein permit selective variation of the position and size of the line-shaped crossover 5 as may be best utilized to match the crossover 5 to the structures to be imaged.

Although modifications and changes may be suggested by those skilled in the art it is the intention of the inventors to embody within the patent warranted hereon all changes and modifications as reasonably and properly come within the scope of their contribution to the art.

We claim as our invention:

1. In a high current electron source having a narrow energy band and having a beam generating system including a cathode, a plurality of focusing electrodes, and a deflection system and an illumination lens disposed after said anode in the direction of electron beam travel, the improvement comprising:

one of said focusing electrodes being disposed between said cathode and said anode and consisting of non-movable means for generating an octupole effect on said electron beam, said means selectively varying the size of said cross-over and the orientation of said cross-over in a plane perpendicular to said electron beam.

2. The improvement of claim 1 further comprising an electron imaging system disposed after said beam generating system in the direction of said electron beam flow.

3. In a high current electron source having a narrow energy band and having a beam generating system including a cathode, a plurality of focusing electrodes, and a deflection system and an illumination lens disposed after said anode in the direction of electron beam travel, the improvement comprising:

one of said focusing electrodes being disposed between said anode and said cathode and comprising an octupole element comprised of two quadrupole elements rotated relatively to one another by 45°, each of said quadrupole elements being supplied with an independently variable potential, said octupole element being non-movable and operable for selectively varying the size of said cross-over and the orientation of said cross-over in a plane perpendicular to said electron beam.

4. The improvement of claim 3 further comprising an electron imaging system disposed after said beam generating system in the direction of said electron beam flow.

5. In a high current electron source having a narrow energy band and having a beam generating system including a cathode, a plurality of focusing electrodes, and a deflection system and an illumination lens disposed after said anode in the direction of electron beam travel, the improvement comprising:

one of said focusing electrodes being disposed between said cathode and said anode and comprising a non-ferromagnetic Wehnelt electrode having a central aperture therein for passage of said electron beam through said Wehnelt electrode in combination with an electromagnetic octupole element disposed perpendicularly to said electron beam and substantially in the plane containing said Wehnelt electrode, said octupole element consisting of two quadrupole element rotated relative to one another by 45°, said quadrupole elements being supplied with independently variable currents.

6. The improvement of claim 5 further comprising an electron imaging system disposed after said beam generating system in the direction of said electron beam flow.

* * * * *